United States Patent [19]
Thornton

[11] Patent Number: 5,438,200
[45] Date of Patent: Aug. 1, 1995

[54] COMPOSITE PHOTODETECTOR SUBSTRATE AND METHOD OF FORMING THE SAME

[75] Inventor: Donald D. Thornton, Goleta, Calif.

[73] Assignee: Santa Barbara Research Center, Goleta, Calif.

[21] Appl. No.: 294,704

[22] Filed: Aug. 23, 1994

[51] Int. Cl.⁶ ............................................. G01N 21/27
[52] U.S. Cl. ............................. 250/338.4; 250/339.02
[58] Field of Search ............. 250/338.4, 339.02, 339.14, 250/342, 370.01

[56] References Cited

U.S. PATENT DOCUMENTS

| | | | |
|---|---|---|---|
| 5,157,258 | 10/1992 | Gunning, III et al. | 250/339.02 |
| 5,159,199 | 10/1992 | LaBaw | 250/339.02 |
| 5,264,699 | 11/1993 | Barton et al. | 250/338.4 |

*Primary Examiner*—Paul M. Dzierzynski
*Assistant Examiner*—Richard Hanig

*Attorney, Agent, or Firm*—W. C. Schubert; W. K. Denson-Low

[57] ABSTRACT

A composite photodetector substrate is provided that can survive the expected functional stresses of a photodetector array and also reduce the number of photons that complete crosstalk paths in the radiation transparent substrates of typical prior photodetector arrays. The composite substrate includes a semiconductor substrate whose thickness is less than that required to survive typically expected functional stresses of the array, and a carrier bonded to the substrate to give the composite substrate the required strength. The reduced thickness of the semiconductor substrate increases the crosstalk path length which nonabsorbed photons travel between photodetectors. The increased path length includes a greater number of surface reflections, thus reducing the number of photons that complete the crosstalk path. The number is further increased by using a carrier that absorbs the radiation of interest.

22 Claims, 3 Drawing Sheets

COMPOSITE PHOTODETECTOR SUBSTRATE AND METHOD OF FORMING THE SAME

BACKGROUND OF THE INVENTION

1. Field of the Invention

The present invention relates generally to semiconductor photodetector arrays, and more particularly to substrate structures and fabrication methods for such arrays.

2. Description Of the Related Art

Detector arrays for sensing electromagnetic radiation include a large number of photodetectors which each simultaneously register incident photons. Detector arrays can be combined with an imaging system that focuses radiation from spatially separate points of a scene onto a focal plane. The detector array is arranged along the focal plane to receive the imaged radiation. Readout electronics transfer the signals generated by the photodetectors to image processing electronics that generate an electronic image of the scene. The signals from spaced photodetectors can also be used to generate positioning information for various uses, e.g., an astronomical star sensor. A spectrometer can be formed by arranging a detector array to receive radiation from a spectral filter. In this use, the detector output signals constitute a spectral image of the light striking the filter.

A variety of compound semiconductor materials are available for detection of electromagnetic radiation across a range of wavelengths, e.g., HgCdTe (mercury-cadmuim-telluride) is a compound semiconductor material that is sensitive in the middle-infrared spectral region. Semiconductors are sensitive to radiation because a portion of photons that strike the semiconductor material are absorbed with the consequent production of mobile carriers, i.e., each absorbed photon produces an electron-hole pair. Photons can also create photocarriers by ionizing impurity atoms and producing single electrons or holes. Photons that are not absorbed pass through the semiconductor material and proceed along a subsequent path.

Semiconductor electronics technology facilitates the concentration of a large number of semiconductor photodetectors, e.g., photoconductors or photodiodes, into a physically small array. Because of their compact nature, such semiconductor arrays are especially sensitive to photon crosstalk between photodetectors; a phenomenon which degrades the electronic image. Photon crosstalk can occur if the subsequent path of the unabsorbed photons of a photodetector intersects any other photodetector in the array. A particularly troublesome crosstalk path occurs in the radiation transparent substrate that is commonly used to carry the array photodetectors.

For example, FIG. 1 shows a prior art detector array 20 which includes an array of photodetectors and a supporting substrate 22. The photoconductor array is exemplified by a pair of spaced photodetectors 23, 24 which are positioned on the front surface 26 of the substrate 22. Generally, the substrate 22 is a grown crystal that has been sawn and ground to its final shape. Typically, the photodetectors are then epitaxially grown on the substrate so that the substrate and the photodetectors form a heterostructure, i.e., a semiconductor structure containing at least two adjacent layers of different chemical composition, but of similar crystalline structure. Fabrication of individual photodetectors may also involve masking and etching operations that are well known in the art.

The photodetectors are appropriately arranged on the substrate's front surface 26 to receive radiation rays, e.g., positioned along a focal plane 27. An exemplary radiation ray 28 is shown to be incident upon one of the photoconductors 24. Some of the photons in the incident radiation ray 28 are absorbed in the photodetector 24 with the consequent generation of electron-hole pairs. If the photodetector 24 is a photoconductor, the generated electron-hole pairs cause a change in its conductivity that is proportional to the photon flux. Alternatively, if the photodetector 28 is a photodiode, the generated electron-hole pairs cause a measurable change in the reverse current of the photodiode that is indicative of the incident photon flux.

Thus, each of the photodetectors of the array can generate a signal in response to the portion of the radiation that is incident upon them and a combination of these signals represents an electronic image of the radiation. If some of the radiation that is initially incident on one of the detectors subsequently travels along a crosstalk path that intersects another of the detectors, the fidelity of the image is proportionately degraded.

FIG. 1 illustrates the substrate crosstalk path between a "sender" photodetector 24 and a "receiver" photodetector 23. Although photoconductors are configured to absorb photons, they typically are only partially opaque to the radiation so that a portion of the incident photons are absorbed and the remainder pass through the photodetector as exemplified by a remainder ray 32 leaving the photodetector 24.

Substrate materials for photodetector arrays are chosen for several attributes which include the following: a) high electrical insulation for isolation of photodetectors, b) similar thermal coefficient of expansion to that of the photodetectors, c) good heat conductivity, and d) crystallographic compatability with the array material. The need for electrical insulation requires a material with a wide bandgap between the conduction and valence bands; as a consequence, semiconductor substrates are generally transparent to the radiation for which the photodetectors are designed.

Because array substrates are typically transparent, the remainder ray 32 can be transmitted through the substrate 20 by reflection between the substrate's back surface 34 and the optically active top surface 26. A particular set of these reflections can cause the ray 32 to follow a crosstalk path 36 that intersects the rear side 38 of the receiver photodetector 23.

Some of the photons that reach the receiver photodetector 23, along the crosstalk path 36, also produce electron-hole pairs and, since the receiver photodetector 23 cannot differentiate photons by their direction of travel, these photons are falsely registered at the image position represented by the photodetector 23. As a result, the electronic image is degraded.

The reflections from the substrate surfaces are mainly due to the difference in the refractive indexes of the substrate 20 and any medium adjoining the substrate. At each of these reflections a portion of the photons are reflected along the path 36 and a portion are lost by passage through the reflecting surface (assuming that the angle of incidence with the surface is greater than the critical angle for total internal reflection). Therefore, the number of photons in the remainder ray 32 diminishes with each lossy reflection. This is graphically indicated in FIG. 1 by the diminishing width of the line that represents the ray 32. In response to this problem of crosstalk, radiation absorptive coatings have typically been applied to either one or both of the back surface 34 and the front surface 26. Although these coatings reduce the number of photons that complete the path 36 by increasing the loss at each reflection, image degradation is still apparent.

The substrate thickness 40 in FIG. 1 must be sufficient to resist breakage due to typically expected functional stresses of the array 20 during its lifetime, e.g., stresses due to handling, vibration and shock. An exemplary prior art detector array intended for detection of infrared radiation employs photoconductors formed of the compound semiconductor HgCdTe (mercury-cadmium-telluride). Suitable substrates for this semiconductor can be formed of the compound semiconductor CdZnTe (cadmium-zinc-telluride) or the compound semiconductor CdTe. The HgCdTe photoconductors are epitaxially grown on the substrate so that the substrate and the photoconductors are crystallographically continuous.

Semiconductors such as HgCdTe are quite fragile and it has generally been found that the substrate thickness 40, for these materials, must be greater than approximately 650 microns to be sufficiently robust to survive the functional stresses unless the substrate 22 is permanently affixed to another structure such as an integrated circuit readout, e.g., as shown in U.S. Pat. No. 5,264,699.

SUMMARY OF THE INVENTION

The present invention is directed to a composite substrate which reduces a photon crosstalk path in the substrate between photodetectors of a photodetector array.

This goal is realized with a recognition that reducing the thickness of the typically transparent substrate of spaced semiconductor photodetectors will increase the number of lossy reflections from substrate surfaces incurred by unabsorbed photons as they attempt to travel a crosstalk path between photodetectors. Accordingly, fewer photons will complete this crosstalk path.

It is further recognized that the mechanical strength lost by the reduced-thickness substrate can be replaced by bonding the substrate to a suitable carrier and that the substrate thickness can be safely reduced during the reducing and bonding processes by supporting it with a removable support member.

Detector arrays in accordance with the invention are characterized by a plurality of spaced semiconductor photodetectors responsive to radiation in a predetermined bandwidth, a carrier, and a substrate positioned between the photodetectors and the carrier. Preferably the substrate thickness is less than 650 microns and the carrier absorbs radiation in the predetermined bandwidth. The carrier has a thickness sufficient to support the substrate.

The novel features of the invention are set forth with particularity in the appended claims. The invention will be best understood from the following description when read in conjunction with the accompanying drawings.

DESCRIPTION OF THE PREFERRED EMBODIMENTS

Composite photodetector substrates, in accordance with the present invention, significantly reduce the number of photons that complete a crosstalk path which typically exists in the substrates of semiconductor photodetector arrays. The present invention is realized by the recognition that the number of photons transmitted between the sender photodetector 24 of FIG. 1 and the receiver photoconductor 23 would be reduced if the path 36 between them included more substrate surface reflections, and that this result can be obtained if the substrate thickness 40 is reduced below that thickness typically required to survive the functional stresses. Since a substrate this thin does not have sufficient physical strength to resist breakage due to normally expected stresses, the invention also provides a method for obtaining a composite substrate that does.

Figure 1:
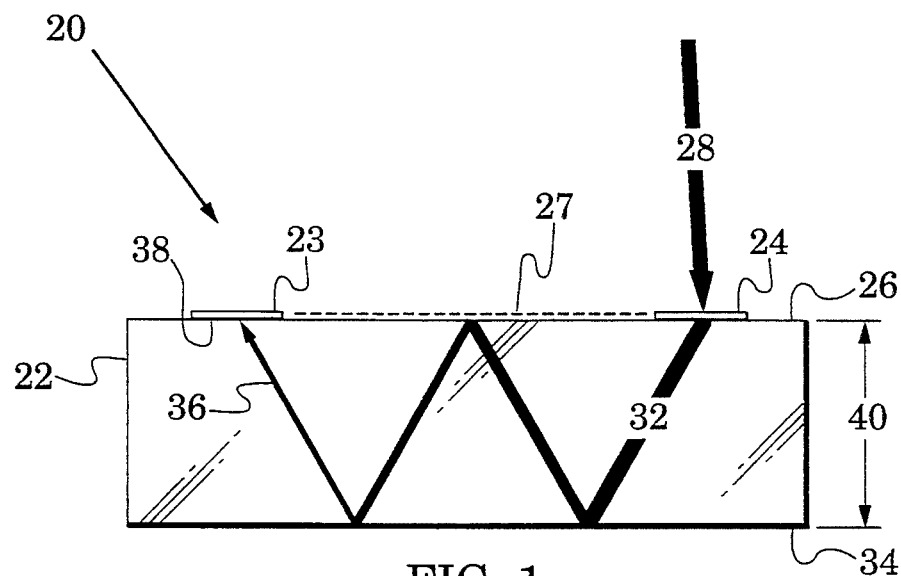
FIG. 1 is side elevation view of a prior art substrate for a semiconductor photodetector array.
Figure 2:
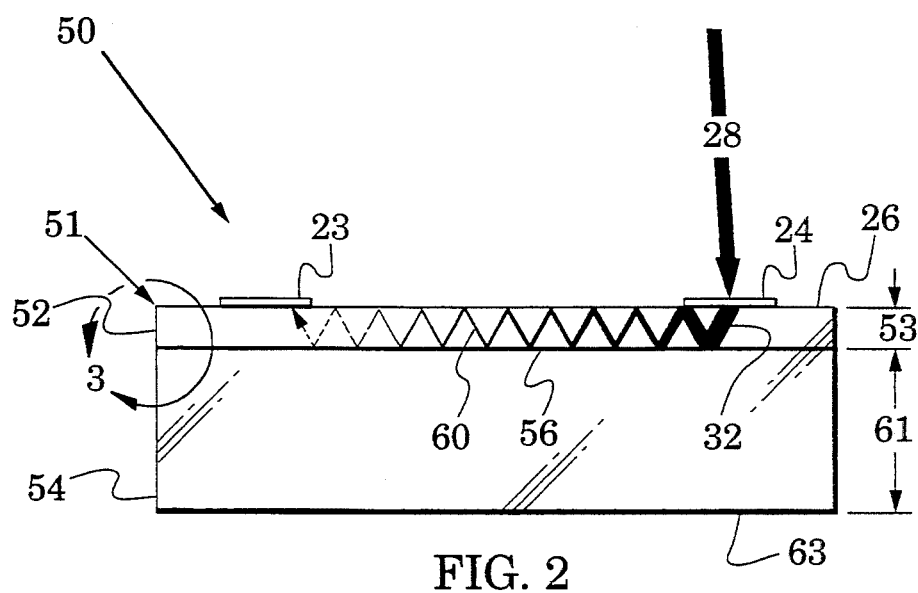
FIG. 2 is side elevation view, described above, of a composite substrate, in accordance with the present invention, for a semiconductor photodetector array.
Figure 3:
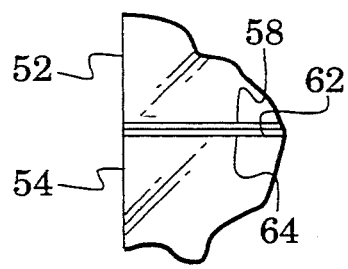
FIG. 3 is an enlarged view of the structure within the curved line 3 of FIG. 2.

As shown in the detector array 50 of FIG. 2, this composite substrate 51 includes a substrate 52 that is similar to the substrate 22 of FIG. 1 but with the thickness 40 of FIG. 1 considerably reduced to the thickness 53 of FIG. 2. To replace the lost mechanical strength, the composite substrate 51 also includes a carrier 54 that is bonded to the back side 56 of the substrate 52 with an adhesive bond 58 as illustrated in the enlarged view of FIG. 3.

The carrier 54 is preferably formed from a material which has a thermal coefficient of expansion closely matched to that of the substrate 52 and which also has good heat conductivity. In addition, the loss at each reflection from the carrier 54 is increased if the carrier is absoptive at the radiation wavelengths being detected, e.g., sapphire is absorptive for radiation wavelengths between approximately 10.5 and 10.8 microns. However, unlike the substrate 52, the carrier 54 need not be an electrical insulator.

In the detector array 50, the same remainder ray 32 (i.e., a ray exiting the photoconductor 24 at the same angle as was shown in FIG. 1) now experiences a far larger number of lossy reflections from the front surface 26 and back surface 56 of the substrate 52 as it follows a crosstalk path 60 that intersects the photodetector 23. Consequently, the number of photons that reach the photodetector 23 is considerably reduced from the number in the array 20 of FIG. 1. This reduction in photon count is indicated by the progressive thinning of the arrow that represents the path 60.

In an exemplary array 50, the substrate 52 would be reduced to have a thickness less than 650 microns with a more preferred thickness less than 200 microns. The carrier would be formed of sapphire and would be bonded to the substrate's back surface 56 with an adhesive, e.g., a suitable epoxy. The carrier thickness 61 between its upper surface 62 and its lower surface 63 would be sufficient to provide the mechanical strength lost by thinning of the substrate 52, i.e., if the substrate's mechanical strength after thinning is less than the strength required to resist the functional stresses by a delta mechanical strength, the carrier thickness would be sufficient to provide at least the delta mechanical strength. Preferably a sapphire carrier would have a thickness greater than 300 microns with a more preferred thickness greater than 500 microns.

Preferably, the upper surface 62 of the carrier 54 is prepared with an absorptive coating 64 prior to the bonding operation. The absorptive coating 64 increases the photon loss at each reflection from the carrier surface 62 along the crosstalk path 60. Exemplary absorptive coatings include dielectric thin films, epoxies such as Cat-A-Lac Black ® and dark mirrors such as those formed with interleaved layers of metal and semiconductor.

It is recognized that although the completed composite substrate 51 has sufficient mechanical strength to resist the functional stresses, the reduced thickness 53 of the substrate 52 causes it to be vulnerable to breakage prior to its bonding onto the carrier 54.

Figure 4A:
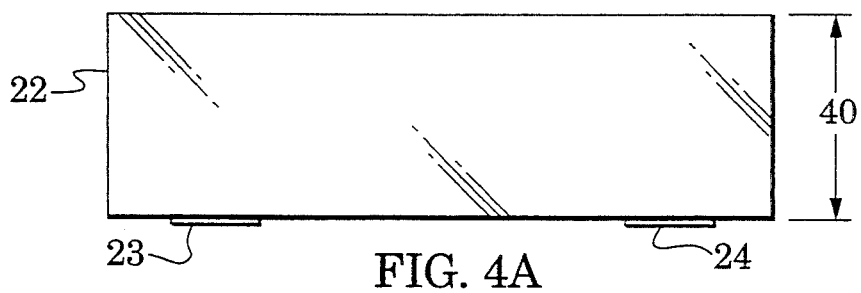
FIG. 4A illustrates a first step in making the array of FIG. 2.
Figure 4B:
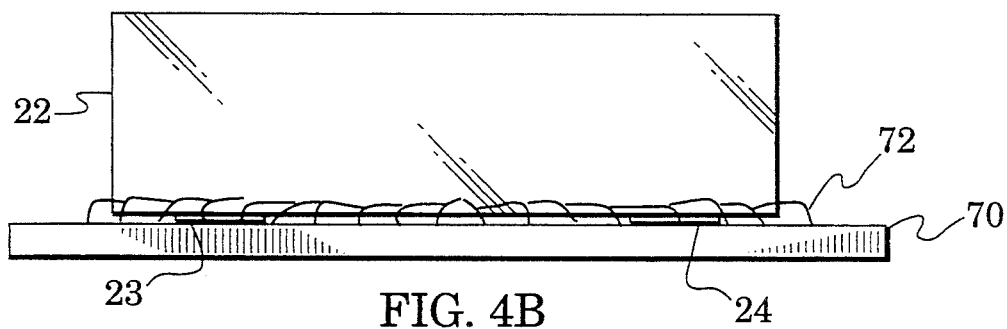
FIG. 4B illustrates a second step in making the array of FIG. 2.

Accordingly, the invention includes a method for fabricating the detector array 50. Initially, as shown in FIG. 4A, a substrate 22 and photodetectors such as the detectors 23, 24 would be formed in ways well known in the art, e.g., by growing the detectors epitaxially on a sawn and ground substrate. The substrate 22 would be formed with a thickness 40 that is sufficient to resist breakage during this fabrication process. Next, the substrate would be temporarily supported along its front surface 26. For example, the substrate can be inverted to place its front surface 26 adjacent to and parallel with a support plate 70 made of a suitable material, e.g., sapphire, silicon. In this case, the substrate 22 is firmly but removably fixed to the support plate 70. This process may be facilitated by the use of a layer of easily removed adhesive 72, e.g., wax, as shown in FIG. 4B.

Figure 4C:
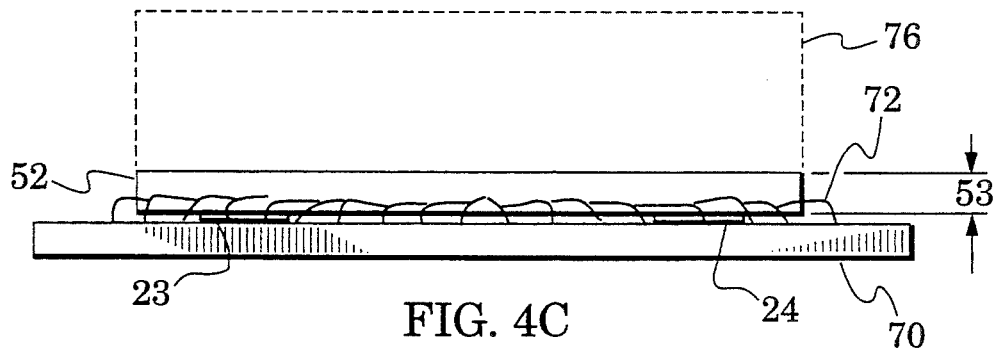
FIG. 4C illustrates a third step in making the array of FIG. 2.
Figure 4D:
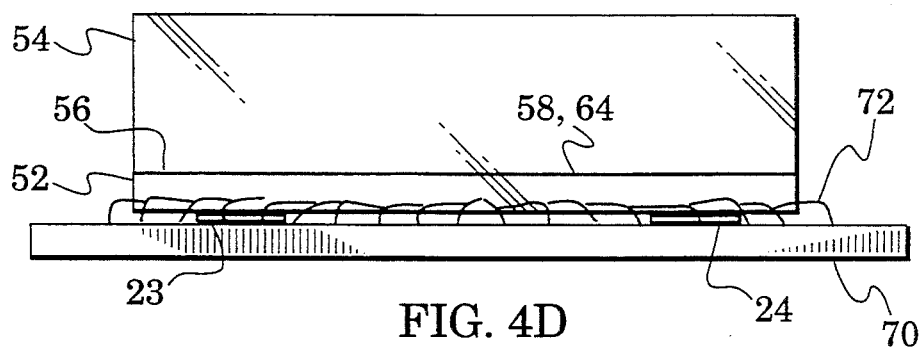
FIG. 4D illustrates a fourth step in making the array of FIG. 2.

The substrate would then be thinned to form the substrate 52 as shown in FIG. 4C, i.e., substrate material would be removed from the area indicated by the broken lines 76 to obtain the thickness 53. This thinning operation can be in accordance with techniques well known in the art, e.g., diamond turning. As mentioned above, the thickness 53 is preferably less than 200 microns. During this thinning operation, the necessary mechanical support to resist breakage is temporarily provided by the support plate 70. With the substrate 52 still mechanically supported by its support plate, the carrier 54 is then permanently bonded to the substrate's back surface 56, e.g., with an adhesive 58 as shown in FIG. 4D. Preferably, the carrier 54 would have previously been prepared with an absorptive coating 64.

Figure 4E:
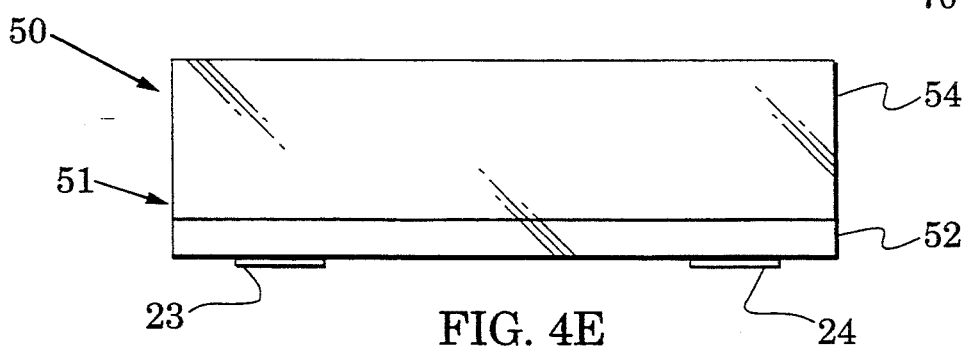
FIG. 4E illustrates a fifth step in making the array of FIG. 2.

Now that the substrate 52 is safely and permanently mounted to the carrier 54, the assembly 50 is removed from the support plate as shown in FIG. 4E and the composite substrate 51 cleaned (taking care to remove any fillets of adhesive 58 from the edges of the composite substrate).

Figure 5:
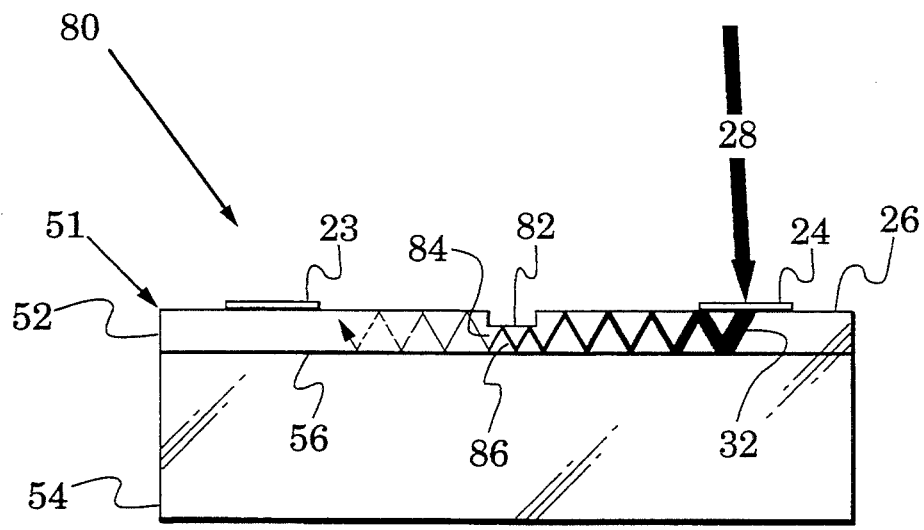
FIG. 5 is a side elevation view of another composite substrate in accordance with the present invention.

Additional photon losses along the crosstalk path 60 of FIG. 1 can be achieved by placing an absorptive coating on the front surface 26 of the substrate 52 in accordance with the prior art. Alternatively, if this surface is free of other array structures, e.g., metal interconnects, the substrate 51 can be further thinned by forming channels that are positioned between photodetectors. For example, FIG. 5 illustrates a detector array 80 that is similar to the array 50 of FIG. 2 but includes a channel 82 in the front surface 26. The channel 82 can be formed by methods well known in the art, i.e., laser scribing or active ion etching.

Figure 6:
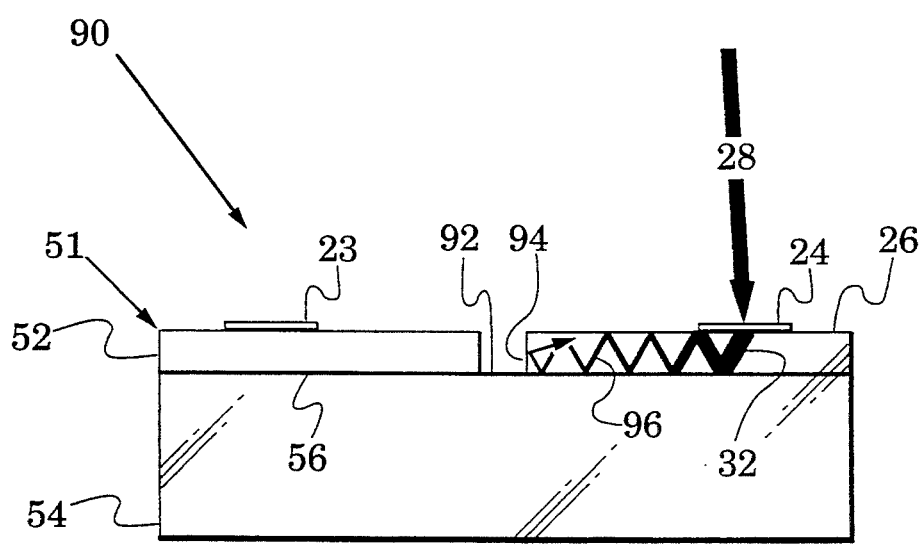
FIG. 6 is a side elevation view of another composite substrate in accordance with the present invention.

The channel 82 is positioned so that it intercepts the path 60 shown in FIG. 2. Because the remaining passage 84 beneath the channel 82 is even thinner than the rest of the substrate 52, the path of the remainder ray 32 now includes more surface reflections (and hence more loss) as shown by the path 86. The channel 82 can be extended to form a channel 92 that communicates with the carrier 54 as shown in the detector array 90 of FIG. 6. In this case, the ray 32 will be further attenuated by total internal reflection from the channel wall 94. That is, the ray 32 may follow the path 96. In the arrays 80 and 90 of FIGS. 5 and 6, the thickness of the carrier 54 may be increased to replace the mechanical strength lost in the substrate 52 by the introduction of the channels 82 and 92.

The composite substrate embodiments disclosed above, in accordance with the present invention, significantly reduce photon crosstalk between array photodetectors while still maintaining sufficient mechanical strength to resist typically expected functional stresses.

While illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A detector array, comprising:
   a composite substrate that includes;
   a) a carrier; and
   b) a semiconductor substrate having first and second opposed surfaces, said substrate carried along said second surface by said carrier; and
   a plurality of semiconductor photodetectors spaced apart on said semiconductor substrate first surface.

2. The detector array of claim 1, wherein said semiconductor substrate has a thickness between said first and second surfaces that is less than 650 microns.

3. The detector array of claim 1, wherein said semiconductor substrate has a thickness between said first and second surfaces that is less than 200 microns.

4. The detector array of claim 1, wherein said semiconductor substrate comprises the compound semiconductor CdTe.

5. The detector array of claim 1, wherein said semiconductor substrate comprises the compound semiconductor CdZnTe.

6. The detector array of claim 1, wherein said photodetectors and said semiconductor substrate are crystallographically continuous.

7. The detector array of claim 6, wherein said photodetector comprises a photoconductor formed of the compound semiconductor HgCdTe.

8. The detector array of claim 1, wherein said carrier comprises sapphire.

9. The detector array of claim 7, wherein said carrier has a thickness greater than 300 microns.

10. The detector array of claim 1, wherein said semiconductor substrate has a thickness between said first and second surfaces that is less than 200 microns and said carrier has a thickness greater than 300 microns.

11. The detector array of claim 1, further including an adhesive bond between said carrier and said semiconductor substrate second surface.

12. The detector array of claim 1, wherein said photodetectors are responsive to radiation in a predetermined bandwidth and said carrier absorbs radiation in said predetermined bandwidth.

13. The detector array of claim 1, wherein said photodetectors are responsive to radiation in a predetermined bandwidth and further including a material disposed between said semiconductor substrate and said carrier that absorbs radiation in said predetermined bandwidth.

14. The detector array of claim 1, wherein said semiconductor substrate defines a channel extending from said first surface towards said second surface, said channel positioned between at least two of said photodetectors.

15. A detector array, comprising:
a plurality of spaced semiconductor photodetectors responsive to radiation in a predetermined bandwidth;
a carrier that absorbs radiation in said predetermined bandwidth; and
a substrate having a thickness less than 650 microns and positioned between said photodetectors and said carrier.

16. The detector array of claim 15, wherein said semiconductor substrate is substantially transparent to radiation in said predetermined bandwidth.

17. The detector array of claim 15, further including a material disposed between said semiconductor substrate and said carrier that absorbs radiation in said predetermined bandwidth.

18. The detector array of claim 15, further including an adhesive bond between said semiconductor substrate and said carrier.

19. The detector array of claim 15, wherein said semiconductor substrate thickness is less than 200 microns.

20. A method of making a detector array, comprising the steps of:
forming a semiconductor substrate with first and second spaced surfaces and a plurality of crystallographically continuous semiconductor photodetectors disposed along said first surface;
temporarily supporting said semiconductor substrate along said first surface;
removing material from said second surface to obtain a third surface that is spaced closer to said first surface than was said second surface;
permanently bonding a carrier to said third surface to support said semiconductor substrate; and
terminating said temporary supporting step.

21. The method of claim 20, wherein said supporting step includes the step of removably bonding said semiconductor substrate to a support member.

22. The method of claim 20, wherein said bonding step includes the step of disposing an adhesive between said semiconductor substrate and said support member.

* * * * *